United States Patent [19]

Leduc

[11] Patent Number: 5,250,838
[45] Date of Patent: Oct. 5, 1993

[54] SEMICONDUCTOR DEVICE COMPRISING AN INTEGRATED CIRCUIT HAVING A VERTICAL BIPOLAR TRANSISTOR

[76] Inventor: Pierre Leduc, 4, rue Amiral Courbet, 14880 Colleville-Montgomery, France

[21] Appl. No.: 474,831

[22] PCT Filed: Dec. 18, 1989

[86] PCT No.: PCT/NL89/00097
  § 371 Date: Sep. 24, 1990
  § 102(e) Date: Sep. 24, 1990

[87] PCT Pub. No.: WO90/07193
  PCT Pub. Date: Jun. 28, 1990

[30] Foreign Application Priority Data

Dec. 16, 1988 [FR] France ............... 88 16640

[51] Int. Cl.[5] .............................. H01L 29/72
[52] U.S. Cl. ...................... 257/578; 257/585; 257/593
[58] Field of Search .......... 357/34, 35; 257/578, 257/585, 593

[56] References Cited

U.S. PATENT DOCUMENTS

| | | | |
|---|---|---|---|
| 3,063,879 | 11/1962 | Strull | 257/578 |
| 4,027,324 | 5/1977 | Yagi et al. | 357/34 |
| 4,032,957 | 6/1977 | Yagi et al. | 357/37 |
| 4,032,958 | 6/1977 | Yagi et al. | 357/37 |
| 4,080,619 | 3/1978 | Suzuki | 357/34 |
| 4,288,708 | 9/1981 | Viral | 307/309 |

Primary Examiner—Andrew J. James
Assistant Examiner—Stephen D. Meier
Attorney, Agent, or Firm—Steven R. Biren

[57] ABSTRACT

The invention relates to an integrated circuit having a vertical transistor. According to the invention, a transistor having a current amplification $\beta$ considerably higher than a conventional transistor is obtained due to the fact that the emitter (5) of the transistor has a thickness and a doping level such that the diffusion length of the minority charge carriers injected vertically into the latter is greater than or equal to the thickness of the emitter (5) and the emitter contact region is so small that during operation the total current of minority charge carriers injected from the base into the emitter region is much smaller than the current density of minority carriers injected from the base into the emitter region under the emitter contact region multiplied by the total surface area of the emitter region.

5 Claims, 2 Drawing Sheets

5,250,838

SEMICONDUCTOR DEVICE COMPRISING AN INTEGRATED CIRCUIT HAVING A VERTICAL BIPOLAR TRANSISTOR

BACKGROUND OF THE INVENTION

The present invention relates to a semiconductor device comprising an integrated circuit with a vertical bipolar transistor having a collector region and an emitter region of a first conductivity type and an intermediate base region of a second conductivity type opposite to the first type, wherein the emitter region has a thickness and doping level such that the diffusion length of the minority charge carriers injected into the emitter during operation is larger than or equal to the thickness of the emitter region and wherein the emitter is covered by an insulating layer which is provided with a contact window through which an electrical contact is provided on an emitter contact region. The emitter contact region might for instance be the part of the emitter region directly adjoining said contact or it can for instance be constituted by an intermediate contact zone of the same conductivity type but of a higher dopant concentration than the emitter region.

In order to obtain a maximum amplification, it is considered hitherto that either only the doping profile of the base or only the doping profile of the emitter can be influenced while maintaining the electrical emitter contact zone on the largest possible emitter surface. This permits of optimizing inter alia the value of the current amplification, which is proportional to the injection efficiency of the emitter-base junction defined by the ratio $\lambda_O$ between the current of minority charge carriers injected into the base and that injected into the emitter.

The present invention is based on the recognition that in the case in which the thickness and the doping level of the emitter region are such that the diffusion length of the minority charge carriers injected vertically into the emitter is larger than the said thickness, the injection phenomena would have to be considered in a quite different manner.

In French Patent FR-2,592,525, the injection phenomenon concerning the lateral transistors has already been envisaged. The basic idea then was to minimize the vertical injection into the base of the transistor in favour of the lateral injection while utilizing the fact that the vertical injection into the emitter is considerably smaller under the surface isolation than under a contact zone. An analysis utilizing a simplified model of the phenomenon then has permitted of determining the optimum conditions of demensions of the emitter contact surface leading to an optimum amplification.

On the contrary, for a vertical transistor, a high amplification can only be obtained by promoting to the highest possible extent the vertical injection into the base, and the preceeding remarks logically lead to the conventional theory according to which the emitter contact zone must occupy the largest possible emitter surface because the injection under a (metal) contact zone is much higher than under the isolation.

SUMMARY OF THE INVENTION

The object of the invention i.a. consists in considerably increasing, preferably at least by a factor 10, this injection efficiency solely by the modification of the geometry of the surface of the emitter.

According to the invention a semiconductor device of the kind described above is characterized in that the emitter contact region is so small that during operation the total current of minority charge carriers injected from the base into the emitter region is much smaller than the current density of minority carriers injected from the base into the emitter region under the emitter contact region multiplied by the total surface area of the emitter region.

The inventor has been able to ascertain, however, that the mechanism of the vertical injection was anything but that which would be expected and that in the aforementioned case and paradoxically with the same emitter surface a reduction of the surface of the emitter contact zone exerts a very favorable influence on the global injection efficiency of the emitter-base junction and hence on the current amplification of the transistor.

Particularly the ratio between the area of the emitter surface and that of the emitter contact region is at least equal to 5 and preferably equal or larger than 10 for instance between 20 and 300. This results in that the global injection efficiency of the emitter-base junction is multiplied by a considerable factor, which may exceed 20. Thus vertical transistors are obtained whose current amplification is much higher than in a comparable conventional transistor and even may exceed 1000.

According to a preferred embodiment, the base and/or the collector have an annular highly doped contacting region.

The invention also relates to a method of manufacturing a semiconductor device comprising a semiconductor device body with an integrated circuit having a vertical bipolar transistor comprising steps of, forming a first region of a first conductivity type above a part of a substrate of a second conductivity type opposite to the first type, the first region adjoining a major surface of the body, as well as forming a second region of the second conductivity type included in the first region, such that the first and second regions are arranged so that they form the base region and the emitter region respectively of the transistor, whose collector region is constituted by the said part of the substrate, providing an insulating layer on the major surface of said semiconductor body, forming a contact window in the insulating layer above an emitter contact region and providing an electrical contact, through the contact window to the emitter contact region, characterized in that the emitter region is given a thickness and a doping level such that the diffusion length of the minority charge carriers vertically injected into the latter is larger than or equal to the thickness of the said emitter region, in that the contact window is given lateral dimensions substantially equal to the minimum permissible dimension in the method, and in that the distance between the contact window and the edge of the emitter is taken at least over part of the periphery of the said zone to be at least equal to three times the nominal alignment tolerance of the method.

BRIEF DESCRIPTION OF THE DRAWING

The invention will be more clearly understood after reading the following description, given by way of non-limitative example, in conjunction with the drawings, in which.

DESCRIPTION OF THE PREFERRED EMBODIMENTS

Figure 1A:
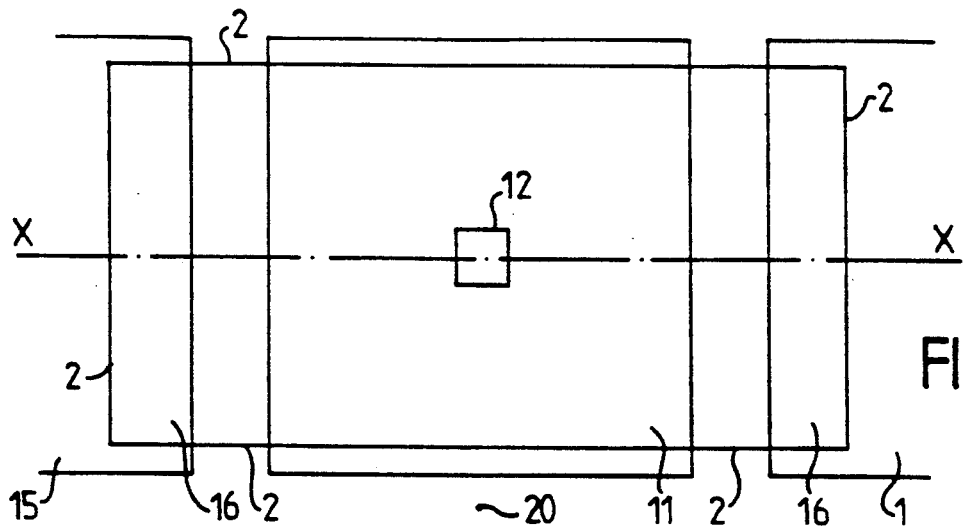
FIGS. 1a and 1b show in plan view and in sectional view XX, respectively, a first embodiment of the invention.
Figure 1B:
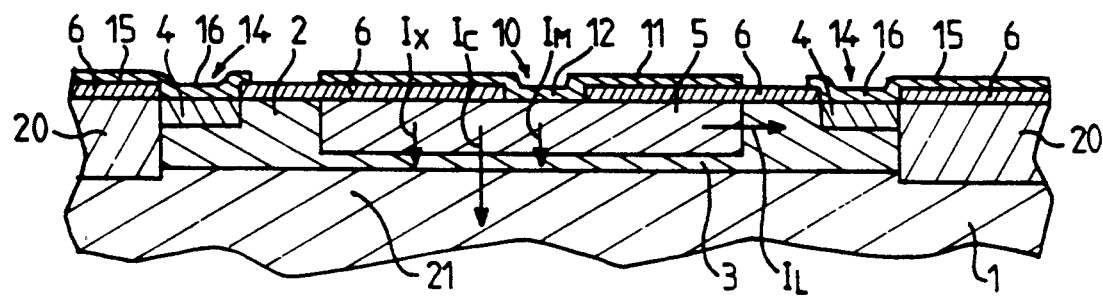

According to FIGS. 1a and 1b, the integrated circuit has a substrate 1 of the p-type comprising a part 21 on which a region 2 of the n-type is deposited by epitaxy, which is surrounded by an isolation island 20 of SiO$_2$ (deep oxide). At the center of the region 2, a p-type region 5 is implanted (thickness of the layer 0.6 $\mu$m) (R=500 $\Omega$/) so that a region 3 is left between the lower part of the latter and the part 21 of the substrate 1. The regions 5, 3 and the part 21 of the substrate 1 constitute the emitter, the base and the collector, respectively, of a vertical transistor. The remaining part of the region 2 serves as base contacting region from the upper surface of the region 2, which constitutes a part of the major surface of the integrated circuit.

With a view to the said contacting regions, the major surface of the integrated circuit is coated at least on the upper surface of the region 2 (inclusive of the region 5) with an isolating layer 6 (thin oxide) having an emitter contact window 10 and at least one base contact window 14. In the base contact windows 14, local n+ regions are diffused, which are intended in known manner to facilitate the contacting.

An emitter metallization surface has at least one region 12 situated in the window 10 so as to form an electrical emitter contact only in a local region of the latter. As will be shown hereinafter, this disposition is paradoxically favorable for obtaining a high current amplification $\mu$ for the vertical transistor.

At least one base metallization surface has at least one region 16 situated in the corresponding window 14 so as to form an electrical base contact on a substantial part of the surface available. In this case, two surfaces are shown, which are situated on either side of the emitter region 5.

Let it be assumed that $I_M$ is the electron injection current in the emitter 5 under the emitter contact zone 5. Let it be assumed that $I_X$ is the injection current of electrons in the emitter 5 under the oxide layer 6. Let is finally be assumed that $I_C$ is the injection current of holes in the base. The emitter contact zone 12 has a surface $S_M$, the oxide layer 6, in its part covering the emitter 5 has a surface $S_X$ and the emitter 5 has a surface $S_E = S_X + S_M$.

The Applicant has been able to show that in the case in which the emitter 5 has a doping and a thickness such that the diffusion length of the minority charge carriers injected into the emitter was greater than or equal to the thickness of the emitter, the various currents $I_M$, $I_X$ and $I_C$ could all be expressed as a function of the base-emitter voltage $V_{BE}$ of the transistor, independently of any geometrical factor. It follows that:

$$I_M = S_M J_M (e^{\frac{V_{BE}}{V_T}} - 1) \quad e = \text{exponential} \tag{1}$$

$$I_x = S_X J_X (e^{\frac{V_{BE}}{V_T}} - 1) \tag{2}$$

$$I_c = S_E J_O (e^{\frac{V_{BE}}{V_T}} - 1) \tag{3}$$

$J_M$, $J_X$ and $J_O$ are constants representing the current densities of injection of electrons under a metallic layer, of electrons under an oxide layer and of holes into the base, respectively.

This basic property of the vertical injection, permits of obtaining the expected results.

In fact, the amplification $\beta$ is then expressed by:

$$\beta = \frac{S_E J_O}{S_M J_M + (S_E - S_M) J_X}$$

or $$\beta = \frac{J_O/J_X}{(J_M/J_X - 1)\frac{S_M}{S_E} + 1}$$

Figure 3:
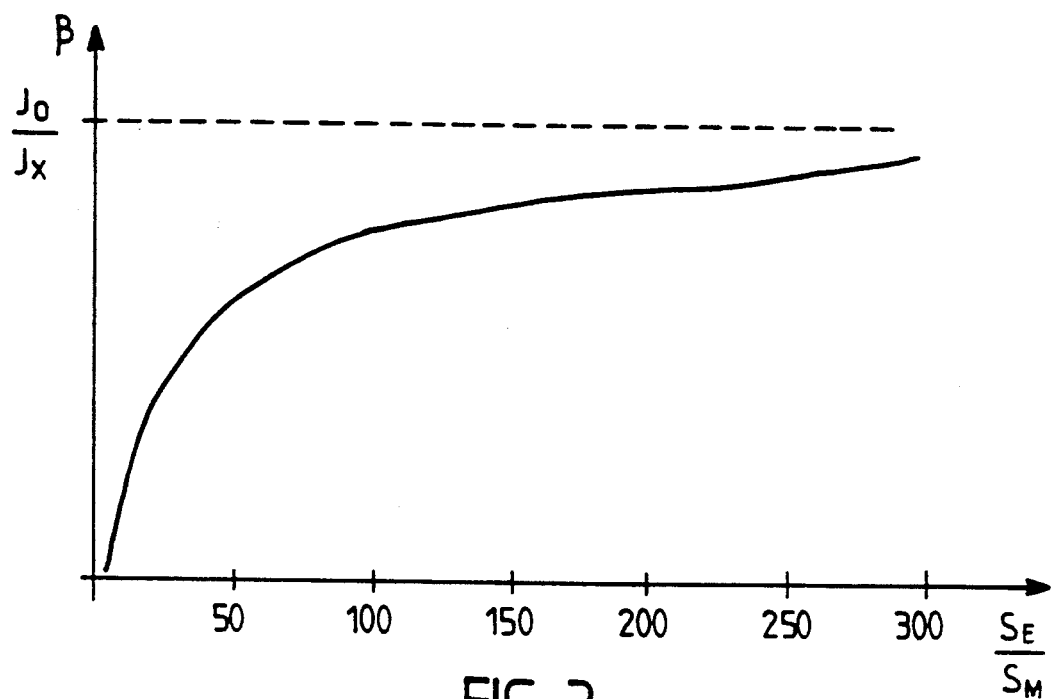
FIGS. 3 and 4 show the curves representing the value of the amplification $\beta$ as a function of $S_E/S_M$ and of the collector current $I_c$, respectively.

It only depends upon the ratio $S_E/S_M$ and is higher as this ratio is higher. The variation of the curve of amplification is given in FIG. 3. It increases upto an asymptotic value $J_O/J_X$. The ratio $J_O/J_X$ represents the injection efficiency $\lambda_O$ according to the conventional junction theory.

By way of example, the following values are given:

$J_M$ = 50 $\quad 10^{-21}$ A/$\mu$m$^2$ $\quad J_O/J_M$ = 58

$J_X$ = 1,3 $\quad 10^{-21}$ A/$\mu$m$^2$ $J_O$ = 2900 $\quad 10^{-21}$ A/$\mu$m$^2$ $\quad J_O/J_X$ = 2230 with a base having a doping of $2.10^{16}$ atoms/cm$^3$ and a depth of 0.8 $\mu$m.

a) For $S_E = 2350$ $\mu^2$, $S_M = 16$ $\mu$m$^2$. If it is assumed that $S_E/S_M = 146$, an amplification $\beta$ of 1620 is measured (for a calculated amplification of 1765).

b) for $S_E/S_M$ or the order of 5 to 7, an amplification $\beta$ of about 150 is measured.

The formula given above neglects the influence of the lateral injection into the base, which explains partly the differences between calculated and measured values, which differences remain within reasonable limits.

Figure 4:
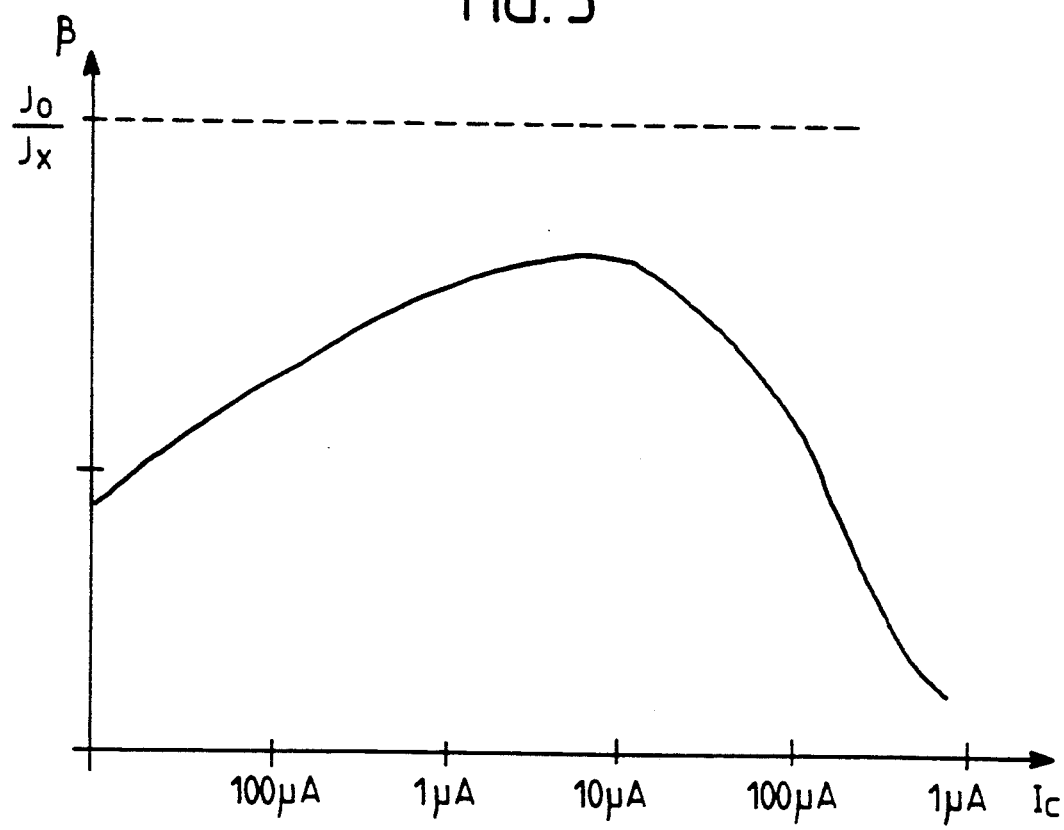

FIG. 4 shows the variation of the curve giving the value of the amplification $\beta$ as a function of the collector current $I_C$ at a collector-base voltage zero. The slight decrease of the amplification at low level is due mainly to the currents $I_X$, which could rather be represented by the following equation:

$$I_x = S_x J_x (e^{\frac{V_{BE}}{M_X V_T}} - 1) \tag{2}$$

$M_X$ being a constant having a value slightly larger than unity.

On the contrary, it is verified by experiments that the current $I_C$ accurately follows the relation (3).

The decreases of the amplification at high current is the consequence of several effects occurring successively.

These effects are the influence of the base resistance, the increasingly higher level of the injection into the base and the state of saturation attained due to the collector resistance.

Figure 2A:
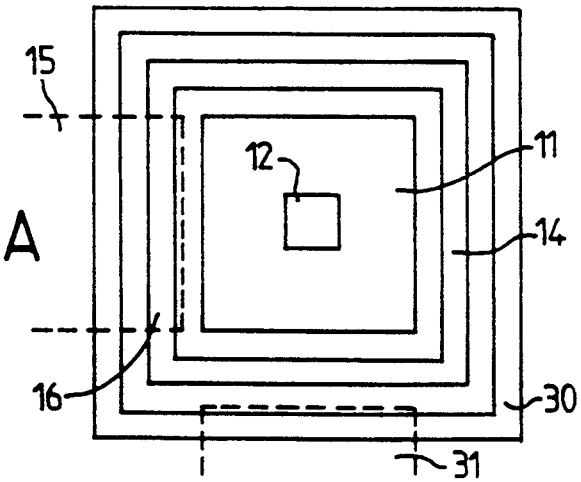
FIGS. 2a and 2b show in plan view and in sectional view, respectively, a preferred embodiment of the invention.
Figure 2B:
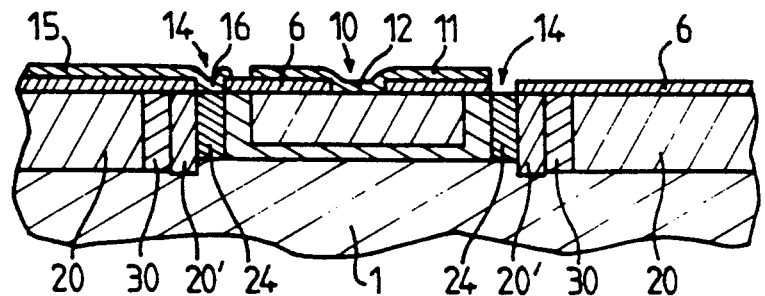

FIGS. 2a and 2b show a preferred embodiment of the invention, in which the base is provided with an n+ base contacting ring 24 extending over the whole depth of the base and permitting of reducing the base resistance and with a p+ collector contacting ring 30 so as to reduce the collector resistance by establishing the collector contact through the major surface of the circuit (metallization 31). The rings 24 and 30 are mutually isolated by a ring 20' of deep oxide formed simultaneously with the layer 20 of deep oxide.

The embodiments shown relate to the case of isolation by oxide. It stands to reason that the invention is not limited to this kind of process and that it may also be applied, for example, to the case of integrated circuits having a junction isolation. Although the invention has been described for the case of transistors of the pnp type, it should be noted that it may also be applied to the case of transistors of the npn type.

I claim:

1. A semiconductor device comprising an integrated circuit with a vertical bipolar transistor having a collector region and an emitter region of a first conductivity type and an intermediate base region of a second conductivity type opposite to the first type, wherein the emitter region has a thickness and doping level such that the diffusion length of the minority carriers injected into the emitter during operation is at least equal to the thickness of the emitter region and wherein the emitter is covered by an insulating layer which is provided with a contact window through which an electrical contact is provided on an emitter contact region, characterized in that the ratio between the area of the emitter region and the area of the emitter contact region is at least equal to 5, thereby causing, during operation, the total current of minority carriers injected from the base into the emitter region to be much smaller than the current density of minority carriers injected from the base into the emitter region under the emitter contact region multiplied by the total surface area of the emitter region.

2. A semiconductor device comprising an integrated circuit with a vertical bipolar transistor having a collector region and an emitter region of a first conductivity type and an intermediate base region of a second conductivity type opposite to the first type, wherein the emitter region has a thickness and doping level such that the diffusion length of the minority carriers injected into the emitter during operation is at least equal to the thickness of the emitter region and wherein the emitter is covered by an insulating layer which is provided with a contact window through which an electrical contact is provided on an emitter contact region, characterized in that the ratio between the area of the emitter region and the area of the emitter contact region is at least equal to 10, thereby causing, during operation, the total current of minority carriers injected from the base into the emitter region to be much smaller than the current density of minority carriers injected from the base into the emitter region under the emitter contact region multiplied by the total surface area of the emitter region.

3. A semiconductor device comprising an integrated circuit with a vertical bipolar transistor having a collector region and an emitter region of a first conductivity type and an intermediate base region of a second conductivity type opposite to the first type, wherein the emitter region has a thickness and doping level such that the diffusion length of the minority carriers injected into the emitter during operation is at least equal to the thickness of the emitter region and wherein the emitter is covered by an insulating layer which is provided with a contact window through which an electrical contact is provided on an emitter contact region, characterized in that the ratio between the area of the emitter region and the area of the emitter contact region lies between 20-300, thereby causing, during operation, the total current of minority carriers injected from the base into the emitter region to be much smaller than the current density of minority carriers injected from the base into the emitter region under the emitter contact region multiplied by the total surface area of the emitter region.

4. An integrated circuit as claimed in one of claims 1, 2, or 3, characterized in that the base (3) has a highly doped region (24) of the second conductivity type extending along its whole periphery.

5. An integrated circuit as claimed in any one of claims 1 to 3, characterized in that the collector region has a highly doped contacting region (30) of the first conductivity type.

* * * * *